United States Patent [19]

Berry

[11] Patent Number: 5,466,991
[45] Date of Patent: Nov. 14, 1995

[54] OPTIMIZED ECR PLASMA APPARATUS WITH VARIED MICROWAVE WINDOW THICKNESS

[75] Inventor: Lee A. Berry, Oak Ridge, Tenn.

[73] Assignee: Sematech, Inc., Austin, Tex.

[21] Appl. No.: 340,140

[22] Filed: Nov. 15, 1994

Related U.S. Application Data

[60] Continuation of Ser. No. 129,211, Sep. 29, 1993, abandoned, which is a division of Ser. No. 916,317, Jul. 17, 1992, Pat. No. 5,306,985.

[51] Int. Cl.$^6$ ........................................ H01J 7/24
[52] U.S. Cl. .................. 315/111.41; 118/723 MW; 315/111.21
[58] Field of Search ................ 315/111.21, 111.41, 315/111.71, 111.81; 118/723 MW, 723 ME, 723 MR

[56] References Cited

U.S. PATENT DOCUMENTS

| | | | |
|---|---|---|---|
| 4,101,411 | 7/1978 | Suzuki et al. | 204/298 |
| 4,298,419 | 11/1981 | Suzuki et al. | 156/345 |
| 4,330,384 | 5/1982 | Okudaira et al. | 204/192 |
| 4,430,138 | 2/1984 | Suzuki et al. | 156/345 |
| 4,462,863 | 7/1984 | Nishimatsu et al. | 156/643 |
| 4,483,737 | 11/1984 | Mantei | 156/643 |
| 4,565,601 | 1/1986 | Kakehi et al. | 156/643 |
| 4,599,100 | 7/1986 | Ninomiya et al. | 156/345 |
| 4,615,761 | 10/1986 | Tada et al. | 156/626 |
| 4,713,585 | 12/1987 | Ohno et al. | 315/111 |
| 4,727,293 | 2/1988 | Asmussen et al. | 313/111 |
| 4,745,337 | 5/1988 | Pichot et al. | 315/111 |
| 4,778,561 | 10/1988 | Ghanbari | 156/643 |
| 4,876,983 | 10/1989 | Fukuda et al. | 118/722 |
| 4,877,509 | 10/1989 | Ogawa et al. | 204/298 |
| 5,032,202 | 7/1991 | Tsai et al. | 156/345 |
| 5,038,712 | 8/1991 | Fujiyama | 118/723 MW |
| 5,079,033 | 1/1992 | Schulz et al. | 118/723 MA |
| 5,111,111 | 5/1992 | Stevens et al. | 315/111.4 |
| 5,306,985 | 4/1994 | Berry | 315/111.41 |

FOREIGN PATENT DOCUMENTS

| | | | |
|---|---|---|---|
| 0449174 | 10/1991 | European Pat. Off. | 315/111.21 |
| 4-171720 | 6/1992 | Japan . | |
| WO92/22085 | 12/1992 | WIPO | H01L 21/00 |

OTHER PUBLICATIONS

"Extremely high selective, highly anisotropic, and high rate electron cyclotron resonance plasma etching for n+ poly-Si at the electron cyclotron resonance position", Samukawa et al.; J. Vac. Sci. Technol. B, vol. 8, No. 6, Nov./Dec. 1990; pp. 1192–1198.

"Optimized microwave coupling in an electron cyclotron resonance etch"; Steven et al., J. Vac. Sci. Technol. A, vol. 9, No. 3; May/Jun. 1991; pp. 696–701.

"ECR Plasma CVD", Seitaro Matsuo, NTT Electrical Communications Laboratories, Atsugi-shi, Kanagawa 243–01, pp. 49–54.

"PDS-17 Plasma Deposition System", ASTEX by Applied Science and Technology, Inc.

Japanese Journal of Applied Physics, Nubuo Fujiwara et al., "High Performance Electron Cyclotron Resonance Plasma Etching with Control of Magnetic Field Gradient", vol. 30, Nov. 1991, pp. 3142–3146.

(List continued on next page.)

Primary Examiner—Robert J. Pascal
Assistant Examiner—Darius Gambino
Attorney, Agent, or Firm—William W. Kidd

[57] ABSTRACT

The present invention describes a technique to control the radial profile of microwave power in an ECR plasma discharge. In order to provide for a uniform plasma density to a specimen, uniform energy absorption by the plasma is desired. By controlling the radial profile of the microwave power transmitted through the microwave window of a reactor, the profile of the transmitted energy to the plasma can be controlled in order to have uniform energy absorption by the plasma. An advantage of controlling the profile using the window transmission characteristics is that variations to the radial profile of microwave power can be made without changing the microwave coupler or reactor design.

6 Claims, 3 Drawing Sheets

OTHER PUBLICATIONS

Patent Abstracts of Japan, vol. 15, No. 263 (C–847) 4 Jul. 1991 and JP,A,03090577 (Hitachi) 16 Apr. 1991.

"ECR Plasma CVD"; Seitaro Matsuo; NTT Electrical Communications Laboratories; Atsugi–shi, Kanagawa 243–01, pp. 49–54.

"Microwave plasma: its characteristics and applications in thin film technology:"; J. Musil; Vacuum, vol. 36, No. 1–3; 1986; pp. 161–169.

"Microwave Plasma Etching", Japanese Journal of Applied Physics, vol. 16, No. 11, Nov. 1977, pp. 1979–1984.

"Electron cyclotron resonance microwave ion sources for thin film processing", L. A. Berry et al., Nuclear Instruments and Methods in Physics Research B56/57 (1991), pp. 1133–1137.

"Electron cyclotron resonance microwave discharges for etching and thin–film deposition", Jes Asmussen; J. Vac. Sci. Technol. A, vol. 7, No. 3; May/Jun. 1989; pp. 883–893.

"Behavior of Ar plasmas formed in a mirror field electron cyclotron resonance microwave ion source", S. M. Gorbatkin et al., J. Vac. Sci. Technol. A 8(3), May/Jun. 1990, pp. 2893–2899.

"Potential applications of an electron cyclotron resonance multicusp plasma source", C. C. Tsai et al., J. Vac. Sci. Technol. A8(3), May/Jun. 1990, pp. 2900–2903.

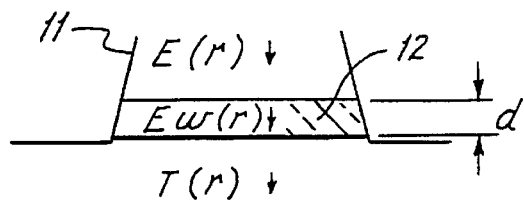
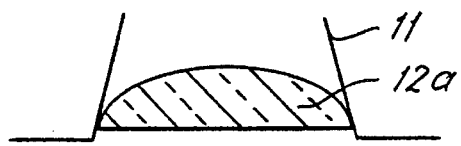
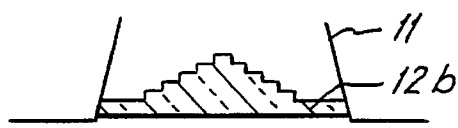
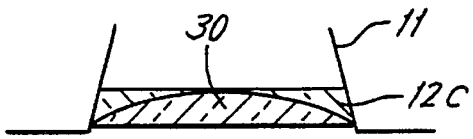

OPTIMIZED ECR PLASMA APPARATUS WITH VARIED MICROWAVE WINDOW THICKNESS

The U.S. Government has rights in this invention pursuant to Contract No. DE-AC05-840R21400 and ERD-89-876 between the Department of Energy and SEMATECH, INC. This application is a continuation of application Ser. No. 08/129,211, filed Sep. 29, 1993, now abandoned, which is a division of application Ser. No. 916,317, filed Jul. 17, 1992, U.S. Pat. No. 5,306,985.

BACKGROUND OF THE INVENTION

1. Field of the Invention

The present invention relates to the field of plasma processing and, more particularly, to the use of plasma equipment for modification of materials.

2. Prior Art

Plasma processing equipment is used extensively in the industry for the process modification of materials. These modifications include etching and depositing of films for the fabrication of microelectronic circuits and semiconductor devices. The modifications may also include implantation of chemical species that change the friction and wear properties of surfaces.

A plasma is a gas (or a gas mixture) which is energized so that it is partially decomposed into species that are electrically charged. Although a number of techniques are known for energizing the gas, electron cyclotron resonance (ECR) plasma processing is one known technique for controlling the plasma with the use of electric (E) and magnetic (B) fields.

ECR plasma production involves the interaction of microwave power with a magnetized plasma at a particular resonant frequency. A well-known and popularly used ECR practice is based on resonance values given by the cold plasma theory. The magnetic field for this resonance is proportional to the microwave frequency and has a magnetic value of 875 Gauss (G) at the resonant microwave frequency of 2.45 gigahertz (GHz). The prior art abounds with references pertaining to the production of plasma at the 875 G/2.45 GHz ECR resonance. Two descriptive articles on ECR plasma production are 1) "Electron cyclotron resonance microwave discharges for etching and thin-film deposition", Jes Asmussen; J.Vac. Sci. Technol. A, Vol. 7, No. 3; May/June 1989; pages 883–893; and 2) "Microwave plasma: its characteristics and applications in thin film technology"; J. Musil; Vacuum, Vol. 36, Nos. 1–3; 1986; pages 161–169.

The plasma technology has been utilized in the semiconductor industry for the purpose of processing the surface of a semiconductor substrate, such as a silicon wafer. Typically, the plasma is used to deposit a layer onto a wafer or, alternatively, it is used to etch a layer on the wafer. A variety of plasma reactors are known in the prior art and the semiconductor industry has developed many enhancements to these reactor designs.

For example, U.S. Pat. No. 4,101,411 discloses an apparatus wherein the surface of a substrate is etched by using ions in a generated plasma. U.S. Pat. No. 4,298,419 describes an apparatus which has a plasma generating chamber for the generation of the plasma and a separate etching chamber where the substrate sample is processed. Subsequent adaptation of the ECR technology was then utilized to practice the technology described in 3) "CVD utilizing ECR plasma"; Transactions of 31st Semiconductor Integrated Circuit Technology Symposium; Dec. 3–4, 1986; pages 49–54; which is shown as prior art in FIG. 1 of U.S. Pat. No. 4,876,983.

However, it soon became apparent that the long transport distance from the plasma formation region to the specimen resulted in the loss (sometimes substantial loss) of the plasma energy, tending to result in the density of the plasma reaching the specimen to be lesser than that of the plasma at or near the resonance zone. Furthermore, the divergence of the magnetic flux lines in the radial direction tended to cause the plasma to diverge as it is transported to the wafer, also resulting in reduced plasma density at the wafer relative to the resonance zone. This technique appears to work reasonably well for processes which are not ion dominated (that is, high plasma densities are not required at the wafer), which do not need low ion energies, and/or which do not require rapid processing.

Although the earlier reactor technology provided desired results for semiconductor wafer processing in the past when wafer diameters were in the order of 4–5 inches, these prior art techniques appear to be inadequate for the processing of larger diameter wafers. As silicon semiconductor technology advances to manufacture devices on wafers having submicron dimensions of 0.5 micron and below, such as 0.35, 0.25, 0.15 micron and below, the industry has moved toward single wafer processing utilizing larger diameter wafers. It has been shown experimentally that as wafer size increases, at and beyond diameters of 200 mm (8 inch), and where topographic features on the wafer are made ever smaller, uniformity is a critical constraint in performing ECR processing.

A variety of techniques have been tried to attempt to provide a more uniform processing over the complete surface of the wafer. One technique is described in U.S. Pat. No. 4,876,983 in which the formation of the plasma (in essence the location of the resonance) is moved closer to the specimen. This is achieved by the ECR zone being located at least partially within the specimen chamber and nearer to the wafer.

A related technique is described, in an article entitled 4) "Extremely high selective, highly anisotropic, and high rate electron cyclotron resonance plasma etching for n+ poly-Si at the electron cyclotron resonance position"; Samukawa et al; J. Vac. Sci. Technol. B, Vol. 8, No. 6, Nov./Dec. 1990; pages 1192–1198; which suggested that a source which would allow processing at higher pressures (over 2 to 3 mTorr) within a few (2 to 10) cm of the ECR zone would reduce density gradients and thus ion energies. In order to preserve uniformity, the stated criterion was that the ECR zone of 875 gauss (G) should have flat contour in space. That is, the suggested technique was to have a flat resonance zone in the reactor and the divergence of the field was to be reduced to maintain the highest possible density with minimum ion energy. The divergent magnetic field is corrected and collimated by the use of a submagnetic field.

However, having a substantially flat magnetic field contour in itself does not assure the formation of a plasma having uniform density across the complete surface of the wafer. That is, for example, uniform microwave power density must be transmitted to the location of the resonance for the formation of a plasma having uniform density.

Experimentations have shown that some plasma control can be obtained by the use of multipole surface magnetic fields to confine the ECR discharge. U.S. Pat. Nos. 4,483,737 and 4,745,337 describe the use of this technique. A multipole design for maintaining a low magnetic field and good uniformity is disclosed in U.S. Pat. No. 5,032,202.

Some additional control is possible by using microwave couplers with different radial profiles of microwave power which is incident on the microwave window as determined by the waveguide mode of the microwave coupler. An example of such an approach is the use of the $TM_{01}$ mode instead of the more typical $TE_{01}$ rectangular or $TE_{11}$ circular modes. However only limited control is possible as the laws of physics constrain the number of possible modes for the dimensions and frequencies of typical processing systems.

Although fairly uniform ECR discharges can be obtained with the above prior art technology, uniform plasma discharge to the wafer is difficult to achieve especially for submicron device fabrication on larger diameter wafers.

SUMMARY OF THE INVENTION

The present invention describes a technique to control the radial profile of microwave power in an ECR plasma discharge. In order to provide for a uniform plasma density at the wafer, uniform energy absorption by the plasma at the ECR zone is desired. By controlling the fraction of the incident microwave power on the microwave window of a reactor which is transmitted to the plasma at any particular radial position on the window, significantly more uniform energy absorption by the plasma can be produced.

The transmission of microwave power through a window is determined by the index of refraction of the window, the thickness of the window, and the index of refraction of the medium (in this case the process plasma) in contact with the window. The present invention is based on varying these three factors, either singly or in combination, across the radius of the microwave window to control the fraction of incident microwave power which is transmitted through the window into the plasma.

In one technique, the radial profile of the plasma index of refraction at the window is controlled by changing the magnetic field radial profile by the use of magnets having small quadrapole trim coils. Small variations in the magnetic field profile at the window produce substantial variations in the index of refraction of the plasma, which can provide for more power to be absorbed by the plasma located underlying the periphery of the window, than at its center. This partially compensates for the decrease in microwave electric field amplitude at the periphery thereby producing a more uniform plasma formation at the ECR zone.

In a second technique, the microwave window is altered to have a radially varying window thickness and/or index of refraction in order to attenuate (transmit less) and/or reflect microwave energy at the window center. The profile of the incident microwave energy transmitted through the window is altered at the window to provide for a more uniform transfer of microwave power to the plasma.

Both of these techniques either alone or together provide for a way to control a radial profile of the microwave power being transmitted and absorbed by the plasma.

BRIEF DESCRIPTION OF THE DRAWINGS

FIG. 5 illustrates the magnitude of the electric field of an incident microwave reaching a microwave window of the reactor.

FIG. 6 shows the conversion of the incident microwave E(r) to the transmitted microwave T(r) due to the presence of the window.

FIG. 7 illustrates a window of the present invention having a curvilinear surface to alter the radial profile of the incident microwave.

FIG. 8 illustrates a window of the present invention having a stepped surface to alter the radial profile of the incident microwave.

FIG. 9 illustrates a window of the present invention having a dielectric gradient surface to alter the radial profile of the incident microwave.

DETAILED DESCRIPTION OF THE PREFERRED EMBODIMENTS

Figure 1:
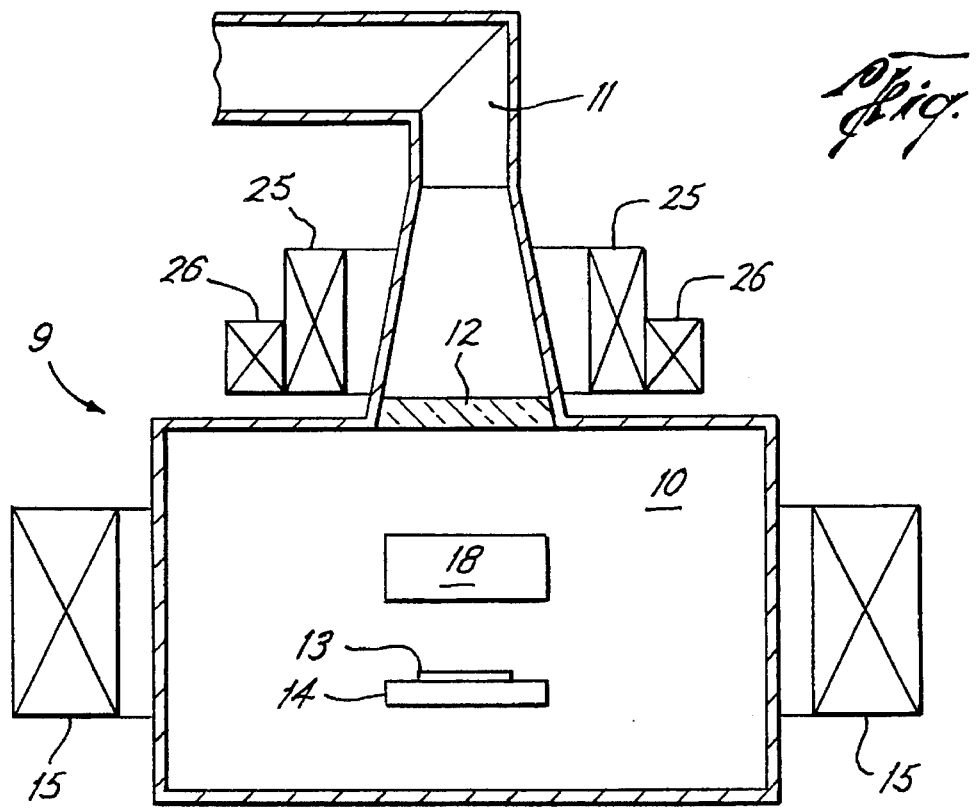
FIG. 1 is a cross-sectional view of an ECR plasma reactor.

A technique for controlling the radial profile of microwave power in an ECR plasma discharge is described. In the following description, numerous specific details are set forth, such as specific devices, measuring techniques, reactor parameters, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention. In addition, a simplified description of the process by which microwave power interacts with the microwave window and the process plasma is used to illustrate the underlying principles of the invention.

As was described in the description of the various prior art techniques, a number of approaches have been devised to process a wafer utilizing electron cyclotron resonance (ECR) produced plasma. In order to uniformly process the surface of a wafer, it is imperative to obtain uniform plasma density at the surface of the wafer. Without the presence of a uniform plasma density at the surface of the wafer, etching and/or deposition steps performed on the wafer will typically result in the formation of non-uniform layers on the wafer. Such non-uniformity is critical when device dimensions are in the submicron range. In addition, uniformity problems are compounded since such submicron dimensioned devices are now being formed on larger diameter wafers (such as 200 mm diameter or greater wafers) which are now being utilized for the manufacture of silicon devices.

The plasma must now be uniform over the increased surface area of the larger diameter wafer. In order to obtain plasma uniformity at the surface of the wafer, a number of factors must be controlled. Experimental results have shown that plasma density (or approximately equivalent, ion current densities or processing rates) are proportional to the applied microwave power. Thus plasma uniformity, in addition to the losses between the ECR zone and the wafer, is also dependent on the uniformity of the absorbed microwave power at the ECR zone. This dependence on uniformity of absorbed microwave power is especially true for ECR sources where the magnetic field is sufficiently strong to prevent radial transport from smoothing gradients in plasma density.

The absorbed microwave power in turn depends on the magnitude of the incident microwave electric field (actually the square of the field) and on the fractional amount of that power which is transmitted to the plasma where it is subsequently absorbed. Although prior art techniques have addressed these concerns indirectly in order to provide for uniformity, they have not addressed control of the incident microwave power profile at the ECR zone to control uniformity.

In order to control plasma density uniformity at the wafer, the radially dependent convolution of three factors must be controlled. First is the magnitude of the incident microwave power which is favorably polarized. The second factor is the amount of that incident power which is transmitted into and subsequently absorbed by the plasma. Lastly, the losses (typically pressure induced) between the ECR zone and the wafer must be controlled.

A number of various prior art techniques can be readily used to control the third factor. One such technique is reducing the physical spacing between the ECR zone and the wafer. Another technique is the use of lower pressures.

A technique to influence the first factor is described in 5) "Optimized microwave coupling in an electron cyclotron resonance etch tool"; Stevens et al." J. Vac. Sci. Technol. A, Vol. 9, No. 3; May/June 1991; pages 696–701. In this technique, globally improved coupling of the 2.45 GHz microwave is obtained by using a right-hand circularly polarized (r.h.c.p.) mode which is matched to the plasma impedance through a quarter-wave transformer.

The present invention provides for a technique for the control of the second factor, which is to control the fraction of the incident power transmitted through the window which is subsequently absorbed by the plasma to produce a uniformly dense plasma at the ECR zone.

Referring to FIG. 1, an ECR plasma reactor 9 is shown. The basic design of reactor 9 can be of a variety of prior art ECR plasma reactors, which typically includes a chamber 10 coupled to a microwave transmission medium, such as a waveguide 11. The waveguide 11 may include a coupling mechanism, such as a microwave coupler, to couple the waveguide 11 to the chamber 10. (For simplicity, waveguide 11 is used to designate either a waveguide or a waveguide/coupler in the following descriptions). At the reactor end of waveguide 11 is a microwave window 12 for coupling the microwave energy into reactor 10. A specimen 13, which the plasma is to operate upon, resides on a platen, such as a chuck 14. For example, specimen 13 can be a silicon semiconductor wafer. Magnets 15 are placed around the reactor chamber 10 for providing the necessary magnetic field (B) for ECR operation. It is to be noted that although only circular magnet 15 is shown, the number, placement and type are strictly a design choice and most ECR magnet(s) used in the prior art can be readily used. When activated an ECR zone 18 is formed near to the upper surface of the specimen 13. These aspects of the invention are known in the art and are adaptable for use with the present invention.

Like light incident on a dielectric, some fraction of an incident microwave beam travelling in waveguide 11 can be reflected from and/or transmitted through window 12. This fraction of the instant beam being reflected and/or transmitted at window 12 can vary across the width of window 12. Furthermore, the incident microwaves also have a profile, depending on the source and waveguide 11.

Figure 2:
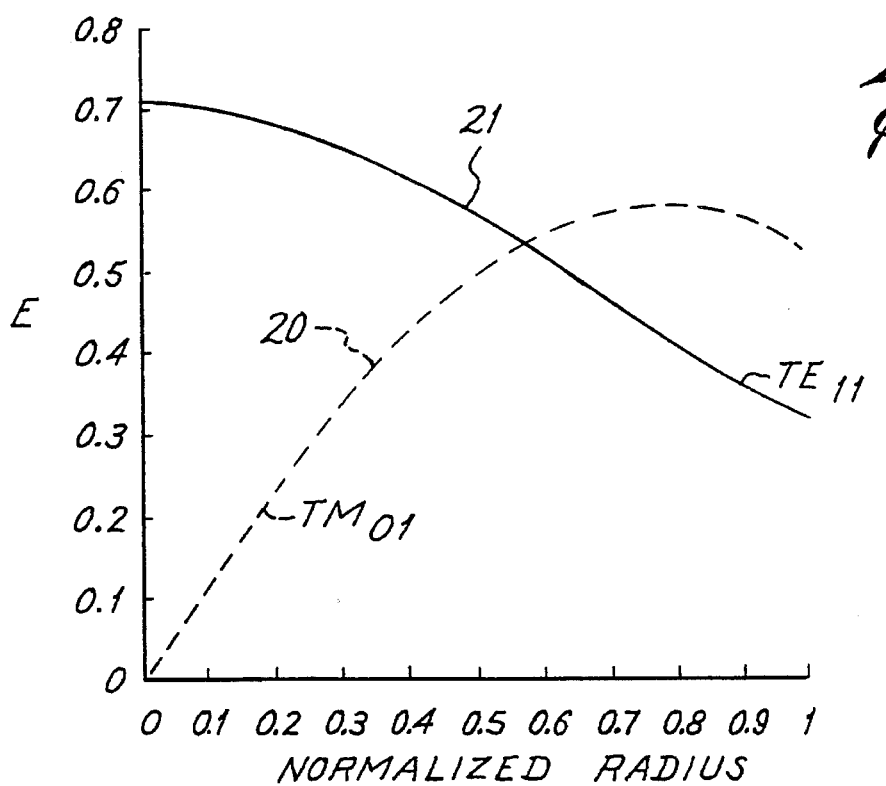
FIG. 2 is a graphical representation showing the relative electric field magnitude versus normalized radius for $TM_{01}$ and $TE_{11}$ modes of operation.

Referring to FIG. 2, a variation in magnitude of the Electric field (E) for two microwave circular waveguide modes commonly used for plasma production is shown as an example. Field patterns for the $TM_{01}$ and $TE_{11}$ modes 20 and 21, respectively, are shown comparing the magnitudes to a normalized radius. The $TM_{01}$ mode is intrinsically symmetric, (that is, no variation in angle within the circular wave guide) while the $TE_{11}$ mode may be polarized in any direction. The particular choice in FIG. 2, pattern 21 is the sum of two $TE_{11}$ modes which are spatially rotated 90 degrees from each other, for example "x" and "y," and are also temporally separated 90 degrees in phase (one quarter of the period of the microwaves). This produces a mode which is substantially circularly polarized.

Figure 3:
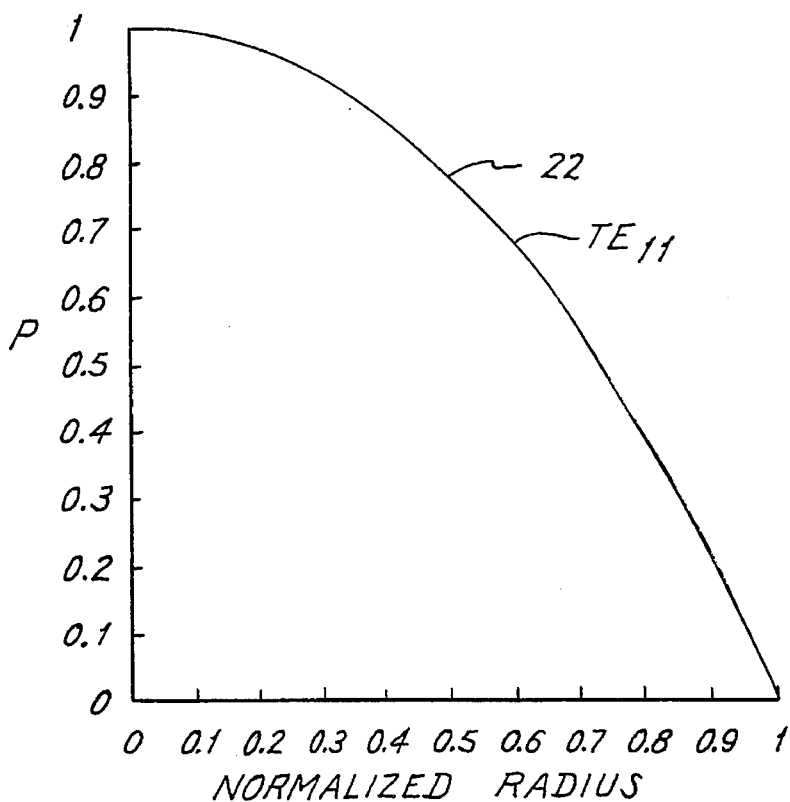
FIG. 3 is a graphical representation of the magnitude of electric field versus normalized radius for a polarized component of $TE_{11}$ mode.

It is to be noted that both modes have a substantial variation in radius. The $TE_{11}$ mode is preferable since it has less variations in magnitude across its radius. However, even for the $TE_{11}$ mode the situation is actually worse than illustrated since the fraction of the microwave E-field that is favorably polarized is highest in the center and falls toward zero at the edge of the window 12. This polarization loss is better illustrated by pattern 22 in FIG. 3. In FIG. 3, pattern 22 shows the magnitude of the polarized component of the electric field versus normalized radius.

Figure 4:
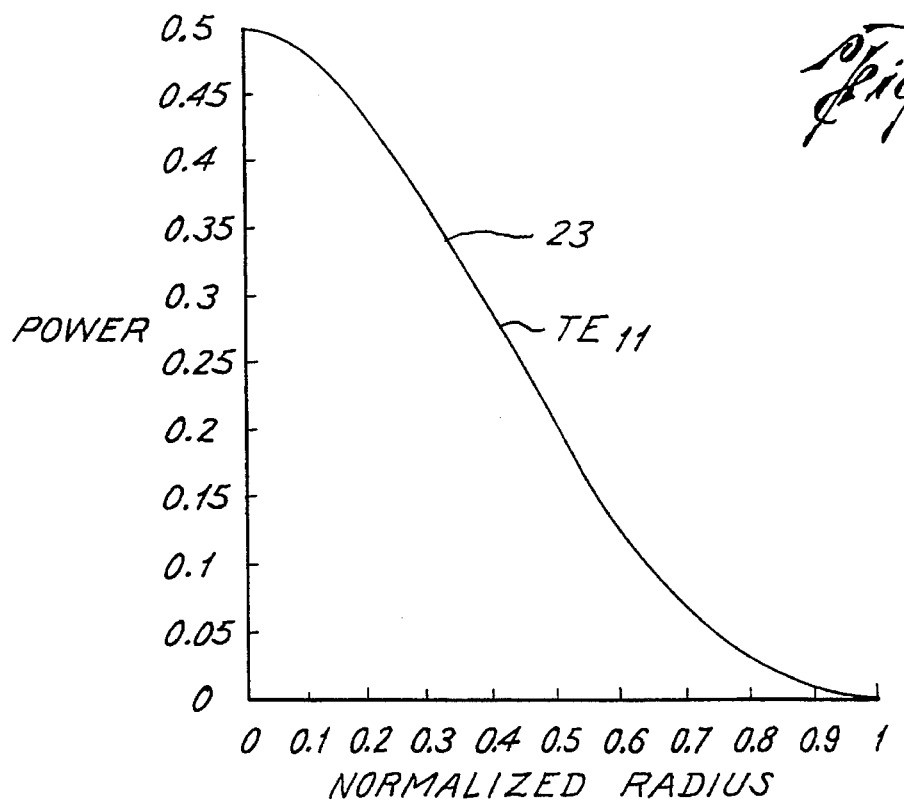
FIG. 4 is a graphical representation of the magnitude of circularly polarized power versus normalized radius for the $TE_{11}$ mode.

Referring to FIG. 4, pattern 23 shows the magnitude of power (P) of the polarized component versus the normalized radius. The polarization loss is of a significant concern since only the favorably polarized portion is available for high density plasma production. Worse yet, the useful incident power is actually the square of the magnitude of the polarized component of the electric field, as is noted in FIG. 4. Thus, it is readily apparent why typically only a fraction of the window area can be utilized for processing. If a typical prior art window is used for window 12, the outer periphery of the window cannot be utilized effectively if uniform plasma discharge is desired. For example, an 8.75 inch wide window is needed in order to process a 6 inch (150 mm) diameter wafer. For 200 mm wafer processing, generally a larger window is required. Accordingly, even though fairly uniform plasma densities may be achieved, the size of the window needed to obtain such results places a significant disadvantage in designing a reactor.

Referring to FIG. 5, it shows the profile of the magnitude of the E-field incident on window 12. The incident E-field is of $TE_{11}$ mode so that the maximum magnitude is at the center of the window 12 and decreases toward the periphery of window 12.

Referring to FIG. 6, it shows the window 12 as well as the transmission characteristics of the incident E field. E(r) is the incident electric field, Ew(r) is the incident component through the window and T(r) is the electric field transmitted to the reactor and, hence, to the plasma. The thickness of the window is noted by "d". Locally, at the interface between the window and the plasma, the incident microwave experiences a problem similar to a dielectric slab between two different half spaces. The underlying principles which govern the microwave reflection and transmission are of concern.

With respect to the flow of power from the window to the plasma, the power P is determined by, $$P = 4n_p/(n_p+n_w)^2 \qquad \text{(Equation 1)}$$

where $n_w$ is the index of refraction for the window and $n_p$ is the index of refraction for the plasma.

The plasma index of refraction ($n_p$) is determined by, $$n_p = \text{sqrt}(1+(n/n_{crit})/(B/B_0-1)) \qquad \text{(Equation 2)}$$

where $B/B_0$ is the ratio of the local magnitude of the magnetic field at the window to 875 gauss and $n/n_{crit}$ is the ratio of the local plasma density to the so called critical density ($n_{crit}$ is approximately $8\times10^{10}$ cm$^{-3}$ for a microwave frequency of 2.45 GHz). For typical materials, $n_w$ is in the range of 2 to 3. For typical plasma parameters, $n_p$ is in the range of 7 to 15.

Because $n_p$ is almost always larger than $n_w$, and because of the relationship in Equation 1, it follows that lower values of $n_p$ will result in a larger fraction of the power being locally transmitted through the window. Since the magnetic field near the window has a natural increase from the center of the window to the periphery, $n_p$ will decrease in value from the center of the window to the periphery. This follows from the above expression for $n_p$ as the quantity $B/B_0-1$ increases. Note that since $B/B_0$ is approximately near unity (typically 1.1 or 1.2 at the window center), even small variations in magnetic field profile at the window can produce substantial variations in $n_p$. As a result more power will be absorbed by the plasma located underlying the periphery of the window 12 than at its center. This increased power absorption by the plasma located at the periphery of the ECR zone at least partially compensates for the decrease in microwave E field amplitude at the window 12 and produces a more uniform plasma at the ECR zone. Thus, a change in the radial profile of the magnetic field at the window allows for a technique to control the power to the plasma for plasma uniformity.

In order to control the radial profile of the magnetic field at the window to achieve plasma uniformity, the present invention uses a system of coils to control the B field at the window. This can be achieved by the initial choice of the size, placement, and current levels of the main magnets 15, as well as by the use of trim coils. For example, small quadrapole trim coils 25 and 26 which produce no net change in the field in the axial direction, can be used to change the radial profile. These coils 25 and 26 are placed typically around the window 12, as is shown in FIG. 1. It is obvious to an experienced practitioner in the design of magnetic fields that a wide variety of electromagnet coil positions and current distributions, as well as permanent magnets, may be used to achieve the desired radial variation in magnetic field. These types of changes in the magnetic field structure may be constrained as the position and shape of the ECR zone 18 could affect losses, however, some significant measure of independent control is possible with sufficiently well localized magnetic field perturbations.

Another technique for controlling the radial profile of the incident microwave in an ECR discharge, is the microwave window itself. As was shown in FIG. 5, the magnitude of the E-field of the microwave is greater at the center of the window than at its periphery for $TE_{11}$ mode. By controlling the attenuation and/or the reflection at the window, the radial profile of the transmitted power T(r) can be controlled at window 12. The properties of the reflected and transmitted wave from a dielectric slab have been used for optical coatings on lenses and a host of other applications in the prior art. These techniques can be readily adapted to provide a microwave window having an effective thickness (effective is defined as thickness measured in wavelengths) and index of refraction. The nature of these techniques is pointed to by the analog to Equation 1 with a dielectric slab instead of a simple interface.

When the second interface is included in the physics analysis, Equation 1 becomes more complicated and now depends on the thickness of the window, d.

Namely:

$$P = \frac{4n_p n_w^2}{n_w^2(1+n_p)^2\cos^2 kd + (n_p+n_w^2)^2\sin^2 kd} \quad \text{(Equation 3)}$$

where $k=2\pi/\lambda$ and $\lambda$ is the microwave wavelength in the window. It should be noted that this discussion is based on a simplified model. However, the more accurate models, which in general require computer-based analysis, have the same characteristics and can be readily determined for a given design.

Referring to FIG. 7, a microwave window 12a is shown having its one face adjacent to the reactor 10 substantially flat, while its opposite face near the waveguide 11 has a convex surface to provide a curvilinear surface. The thickness of the window at the periphery is chosen for maximum transmitted microwave power (often it will be for a window one quarter wavelength in thickness) while the dimension in the middle is thicker than needed for optimum coupling. Alternatively, but not illustrated, the window could be made thinner in the middle with equivalent results. Also not shown, the direction of curvature could be towards the plasma.

Referring to FIG. 8, a differently structured microwave window 12b is shown. Window 12b has an equivalent effect as window 12a, except that it is stepped instead of being continuously curvilinear. The window 12b is comprised of a number of stepped sections atop a base section. The base section is disposed completely across the opening and each subsequent section is of a smaller width. Essentially, FIG. 8 provides for a discrete surface while FIG. 7 provides for a curvilinear surface. The windows 12a and 12b provide for a varying d depending on the radial location. As was the case with the window 12a of FIG. 7, the shape could be altered to provide equivalent results.

Alternatively, a window having a constant physical thickness can be used as is shown in FIG. 9. Window 12c has a constant dimension, but has a dielectric gradient which is shown by shaded region 30. The dielectric gradient effectively operates to provide equivalent results as windows 12a.

Windows 12a–12c provide for radially varying attenuation to control the microwave power profile transmitted to the plasma. Windows 12a–12c attenuate (transmit less) the portion of the $TE_{11}$ microwave near the center of the respective window where the magnitude is greater. By this attenuation, power transmitted to the plasma is attenuated near the center of the ECR zone 18 and the plasma made more uniform.

It is to be appreciated that a variety of techniques can be utilized to control the window thickness and/or the index of refraction to obtain desired E-field profile to be transmitted to the plasma. Typically, the desired profile is a T(r) having substantially uniform magnitude.

It is to be noted that the desired T(r) to obtain uniform plasma density can be achieved with using either the magnetic control or the window design. Furthermore, both techniques can be used together. In such a combination, the window will provide for a fixed means for coarse control of the radial profile and the trim coils would provide for a variable means for fine tuning the radial profile. Such fine tuning controls may be needed in order to compensate for variations in plasma impedance and dielectric loss between the ECR zone 18 and specimen 13.

Additionally, polarization of the incident microwave is of little concern when practicing the present invention. The non-polarized component can be matched or, if not matched, then it can be reflected at the window. Thus, the mode of operation is inconsequential for an ECR plasma system using the present invention.

Finally, it is to be noted that the resonance can be selected at a desired zone. Although 2.45 GHz/875 G values are derived from the cold plasma theory, investigations in this area indicate that the more realistic ECR zone is established at 2.45 GHz/925–975 G. The phenomenon is speculated to be caused by the doppler shifting of the microwave acting on the electrons of the plasma. However, the location of the actual ECR zone is tangential to the practice of the present invention.

Thus, the present invention provides for a technique to control the radial profile of the microwave power at the window in order to control ECR plasma uniformity without changing the coupler or the reactor design.

I claim:

1. An electron cyclotron resonance (ECR) plasma apparatus for processing a specimen comprising:

a plasma reactor for having said specimen disposed therein and in which an ECR zone is formed for discharge of plasma to process said specimen;

an electrical energy source for providing incident microwave energy to generate an electric field component for formation of said ECR zone in said reactor;

a microwave window coupled between said plasma reactor and said electrical energy source for directing said incident microwave energy as transmitted microwave energy to said ECR zone;

at least one main magnetic coil coupled about said reactor for generating a magnetic field component for formation of said ECR zone in said reactor;

said microwave window having a radial profile variation in effective thickness, which is measured in wavelengths, that corresponds to a non-uniform radial profile of amplitude of said incident microwave energy across said microwave window, wherein said radial profile variation of said microwave window attenuates or reflects said incident microwave energy correspondingly across its radial profile, such that said transmitted microwave energy from said window is compensated by said microwave window to have a substantially uniform amplitude across its radial profile in order to provide uniform absorption of said transmitted microwave energy by said plasma across its radial profile so as to provide uniform density plasma formation for discharge to said specimen.

2. The ECR plasma apparatus of claim 1 wherein said microwave window has a varying physical thickness in order to obtain said variation in effective thickness.

3. The ECR plasma apparatus of claim 1 wherein said microwave window has a constant physical thickness, but having a dielectric gradient in order to provide for said variation in effective thickness.

4. In an electron cyclotron resonance (ECR) plasma processing apparatus, having a reactor for processing a gas, wherein said reactor is coupled to an electrical energy source which provides incident microwave energy and wherein said reactor is also coupled to a magnetic coil, a method for providing uniform density plasma formation for discharge to a specimen, comprising the steps of:

introducing said gas into said reactor;

introducing said incident microwave energy in order to generate an electric field component for formation of an ECR zone in said reactor;

activating said magnetic coil to introduce a magnetic field component for formation of said ECR zone in said reactor;

controlling a radial profile variation in effective thickness, which is measured in wavelengths, of a microwave window disposed between said electrical energy source and said reactor and in which said variation in effective thickness of said microcode window corresponds to a non-uniform radial profile of amplitude of said incident microwave energy across said microwave window, wherein said radial profile variation of said microwave window attenuates or reflects said incident microwave energy correspondingly across its radial profile, such that transmitted microwave energy from said window to said ECR zone is compensated by said microwave window to have a substantially uniform amplitude across its radial profile in order to provide uniform absorption of said transmitted microwave energy by said plasma across its radial profile so as to provide uniform density plasma formation for discharge to said specimen.

5. The method of claim 4 wherein said microwave window has a varying physical thickness in order to obtain said variation in effective thickness.

6. The method of claim 4 wherein said microwave window has a constant physical thickness, but having a dielectric gradient in order to provide for said variation in effective thickness.

\* \* \* \* \*